US010325974B2

United States Patent
Hu et al.

(10) Patent No.: US 10,325,974 B2
(45) Date of Patent: Jun. 18, 2019

(54) DISPLAY SUBSTRATE, MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Like Hu, Beijing (CN); Xiaoxiang He, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 15/683,597

(22) Filed: Aug. 22, 2017

(65) Prior Publication Data
US 2018/0145122 A1 May 24, 2018

(30) Foreign Application Priority Data
Nov. 18, 2016 (CN) .......................... 2016 1 1025345

(51) Int. Cl.
*H01L 27/32* (2006.01)
*G02F 1/1343* (2006.01)
*G02F 1/1362* (2006.01)

(52) U.S. Cl.
CPC ...... *H01L 27/3272* (2013.01); *G02F 1/13439* (2013.01); *H01L 27/3248* (2013.01); *G02F 2001/134381* (2013.01); *G02F 2001/136218* (2013.01)

(58) Field of Classification Search
CPC .......................... H01L 27/32; H01L 27/3232
See application file for complete search history.

(56) References Cited

U.S. PATENT DOCUMENTS

| | | | |
|---|---|---|---|
| 2004/0145551 A1 | 7/2004 | Tobita | |
| 2011/0181502 A1* | 7/2011 | Kim | G02F 1/167 345/107 |
| 2014/0160102 A1* | 6/2014 | Wang | G02F 1/13624 345/211 |
| 2017/0285859 A1* | 10/2017 | Shepelev | G06F 3/0418 |

FOREIGN PATENT DOCUMENTS

CN    1517967 A    8/2004

OTHER PUBLICATIONS

First Office Action for Chinese Application No. 201611025345.8, dated Feb. 2, 2019, 7 Pages.

* cited by examiner

*Primary Examiner* — Jae Lee
(74) *Attorney, Agent, or Firm* — Brooks Kushman P.C.

(57) ABSTRACT

The present disclosure provides a display substrate, a manufacturing method thereof, and a display device. The display substrate includes a shielding pattern created from a layer identical to a pixel electrode and configured to prevent a display function of a display function layer from being adversely affected by a signal from a signal line.

19 Claims, 5 Drawing Sheets

DISPLAY SUBSTRATE, MANUFACTURING METHOD THEREOF, AND DISPLAY DEVICE

CROSS-REFERENCE TO RELATED APPLICATION

This application claims priority to Chinese Patent Application No. 201611025345.8 filed on Nov. 18, 2016, which is incorporated herein by reference in its entirety.

TECHNICAL FIELD

The present disclosure relates to the field of display technology, in particular to a display substrate, a manufacturing method thereof, and a display device.

BACKGROUND

Due to the advantages such as small volume, low power consumption and low manufacture cost, Thin Film Transistors (TFTs) have been widely applied to flat-panel display devices.

For a TFT display technology, on and off states of the TFT are controlled through gate lines. A signal is applied from a data line to a pixel electrode through the TFT, so as to form a driving electric field, thereby to drive a display function layer to display an image. For some display devices, e.g., electronic papers, the gate lines and the data lines are arranged very close to electronic ink, so normal display of the electronic papers may be adversely affected. A planarization layer is very thick, and it may be arranged on the gate lines and the data lines, so as to increase a distance between the electronic ink and the gate/data lines, thereby to reduce the interference of the signal from the gate lines or data lines on the electronic ink. However, due to the additional planarization, the manufacture cost may inevitably increase.

SUMMARY

An object of the present disclosure is to provide a display substrate, a manufacturing method thereof, and a display device, so as to prevent the normal display of the display device from being adversely affected by a voltage across a signal line without an increase in the manufacture cost.

In one aspect, the present disclosure provides in some embodiments a display substrate, including a signal line configured to transmit a signal, a display function layer configured to display an image, and a pixel electrode. The display substrate further includes a shielding pattern arranged at a layer identical to and insulated from the pixel electrode. The shielding pattern is arranged at a side of the signal line adjacent to the display function layer, and an orthogonal projection of the signal line onto a plane where the display substrate is located is located within an orthogonal projection of the shielding pattern onto the plane where the display substrate is located.

In another aspect, the present disclosure provides in some embodiments a display device including the above-mentioned display substrate.

In yet another aspect, the present disclosure provides in some embodiments a method for manufacturing the above-mentioned display substrate, including steps of: forming a signal line configured to transmit a signal; forming a display function layer configured to display an image; and forming a pixel electrode configured to generate an electric field for driving the display function layer to display the image. The method further includes forming a shielding pattern together with the pixel electrode using an identical conductive thin film through a single patterning process. The shielding pattern is insulated from the pixel electrode, and arranged at a side of the signal line adjacent to the display function layer. An orthogonal projection of the signal line onto a plane where the display substrate is located is located within an orthogonal projection of the shielding pattern onto the plane where the display substrate is located.

According to the embodiments of the present disclosure, the shielding pattern is formed at a layer identical to the pixel electrode and configured to prevent a display function of the display function layer from being adversely affected by the signal from the signal line, without any additional planarization layer or any process for patterning the planarization layer. As a result, it is able to simplify the manufacture process and reduce the manufacture cost.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
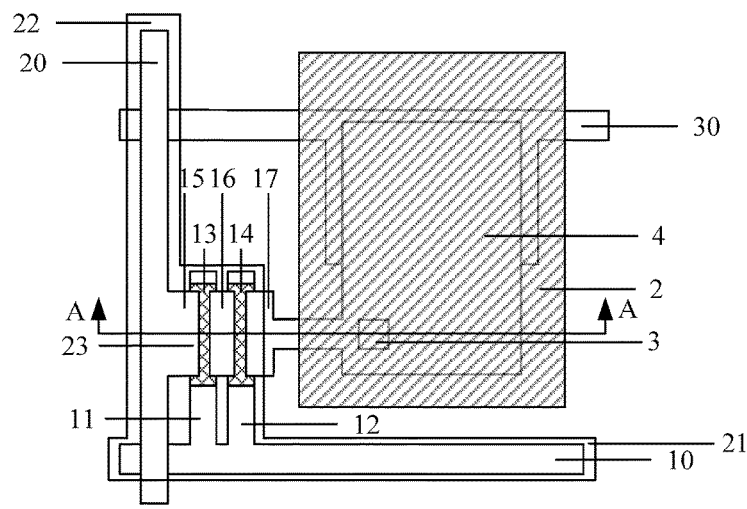
FIG. 1 is a schematic view showing a display substrate according to an embodiment of the present disclosure.

The present disclosure will be described hereinafter in conjunction with the drawings and embodiments. The following embodiments are for illustrative purposes only, but shall not be used to limit the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a display substrate, including a signal line configured to transmit a signal, a display function layer configured to display an image, and a pixel electrode configured to generate an electric field for driving the display function layer to display the image. The display substrate further includes a shielding pattern arranged at a layer identical to and insulated from the pixel electrode. The shielding pattern is arranged at a side of the signal line adjacent to the display function layer, and an orthogonal projection of the signal line onto a plane where the display substrate is located is located within an orthogonal projection of the shielding pattern onto the plane where the display substrate is located. The shielding pattern may be used to prevent a display function of the display function layer from being adversely affected by the signal from the signal line.

According to the display substrate in the embodiments of the present disclosure, the shielding pattern is arranged at a layer identical to the pixel electrode and configured to prevent the display function of the display function layer from being adversely affected by the signal from the signal line, without any additional planarization layer or any process for patterning the planarization process. As a result, it is able to simplify the manufacture process and reduce the manufacture cost.

It should be appreciated that, in the embodiments of the present disclosure, in the case that an orthogonal projection of one member onto the plane where the display substrate is located is located within an orthogonal projection of another member onto the plane where the display substrate is located, it means that an area of the orthogonal projection of the one member onto the plane is smaller than or equal to an area of the orthogonal projection of the other member onto the plane, and the orthogonal projection of the one member onto the plane does not go beyond the orthogonal projection of the other member onto the plane.

The display substrate in the embodiments of the present disclosure may be a liquid crystal display substrate, an Organic Light-Emitting Diode (OLED) display substrate, or an electronic paper display substrate. Correspondingly, the display function layer may be a liquid crystal layer, a light-emitting layer or an electronic ink layer.

Due to the advantages such as small volume, low power consumption and low manufacture cost, TFTs have been widely applied to flat-panel display devices. In the case that the display substrate is controlled by the TFT so as to display the image, each pixel region may be controlled by the TFT. In other words, each pixel region of the display substrate may include the TFT. The display substrate may further include a plurality of gate lines and a plurality of data lines, so as to define a plurality of pixel regions. More details will be given in conjunction with FIGS. 1 to 9.

As shown in FIG. 1, the display substrate includes a TFT, a plurality of gate lines 10 and a plurality of data lines 20. A gate electrode of the TFT is electrically connected to the gate line 10, a source electrode thereof is electrically connected to the data line 20, and a drain electrode thereof is electrically connected to the pixel electrode 2. The TFTs for the pixel regions may be turned on progressively through a gate scanning signal, and a pixel voltage from the data line 20 may be applied to the pixel electrode 2 through the TFT, so as to form the driving electric field.

Figure 3:
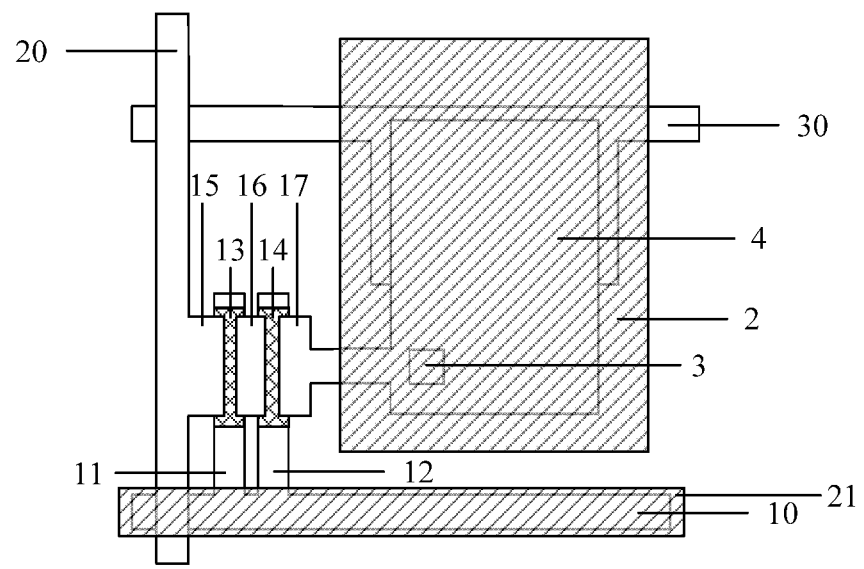
FIG. 3 is another schematic view showing the display substrate according to an embodiment of the present disclosure.

In order to prevent the display function of the display function layer from being adversely affected by the signal from the gate line, as shown in FIG. 3, the shielding pattern may include a first shielding pattern 21. An orthogonal projection of the gate line 10 onto the plane where the display substrate is located is located within an orthogonal projection of the first shielding pattern 21 onto the plane where the display substrate is located. The first shielding pattern 21 is capable of preventing the display function of the display function layer from being adversely affected by the signal from the gate line 10.

In a possible embodiment of the present disclosure, the first shielding pattern 21 may be spaced apart from the pixel electrode 2 by a certain distance, so as to enable them to be insulated from each other. The first shielding pattern 21 may be connected to a power source whose output voltage is adjustable, so as to achieve a shielding effect. For the electronic paper display substrate, a voltage applied to the first shielding pattern 21 may be adjusted, so as to control the electronic ink on the first shielding pattern 21 to display the image, e.g., a black or white image. Of course, in the case that a fixed voltage is applied to the first shielding pattern 21 or the first shielding pattern 21 is grounded, it is still able to achieve the shielding effect.

Figure 4:
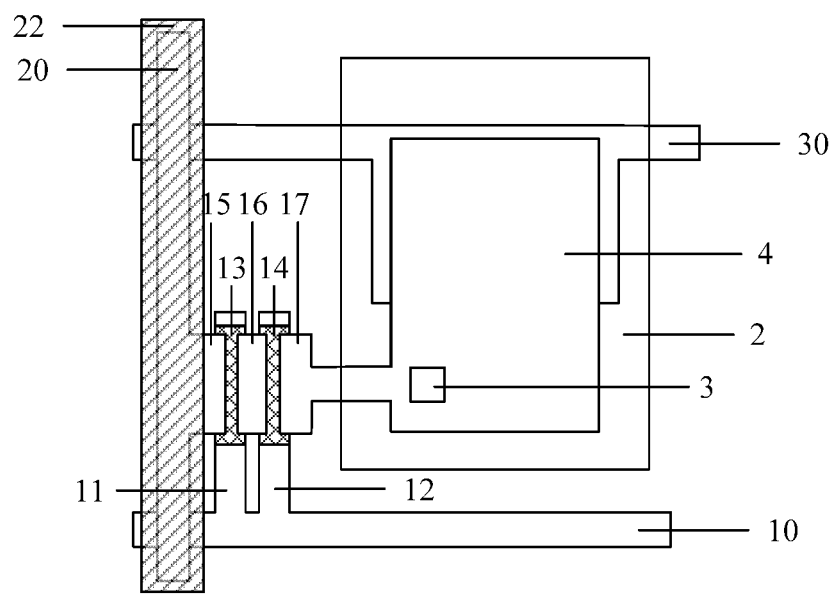
FIG. 4 is yet another schematic view showing the display substrate according to an embodiment of the present disclosure.

In order to shield the signal from the data line, as shown in FIG. 4, the shielding pattern may include a second shielding pattern 22. An orthogonal projection of the data line 20 onto the plane where the display substrate is located is located within an orthogonal projection of the second shielding pattern 22 onto the plane where the display substrate is located. The second shielding pattern 2 is capable of preventing the display function of the display function layer from being adversely affected by the signal from the data line 20.

In a possible embodiment of the present disclosure, the second shielding pattern 22 may be spaced apart from the pixel electrode 2 by a certain distance, so as to enable them to be insulated from each other. The second shielding pattern 22 may be connected to a power source whose output voltage is adjustable, so as to achieve a shielding effect. For the electronic paper display substrate, a voltage applied to the second shielding pattern 22 may be adjusted, so as to control the electronic ink on the second shielding pattern 22 to display the image, e.g., a black or white image. Of course, in the case that a fixed voltage is applied to the second shielding pattern 22 or the second shielding pattern 22 is grounded, it is still able to achieve the shielding effect.

In a possible embodiment of the present disclosure, as shown in FIG. 1, the shielding pattern may include both the first shielding patter 21 and the second shielding pattern 22, so as to prevent the display function of the display function layer from being adversely affected by both the signals from the gate line 10 and the data line 20. Further, the first shielding pattern 21 and the second shielding pattern 22 may be formed integrally. To be specific, each of the first shielding pattern 21 and the second shielding pattern 22 may be spaced apart from the pixel electrode 2 by a certain distance, so as to enable each of them to be insulated from the pixel electrode 2.

Figure 5:
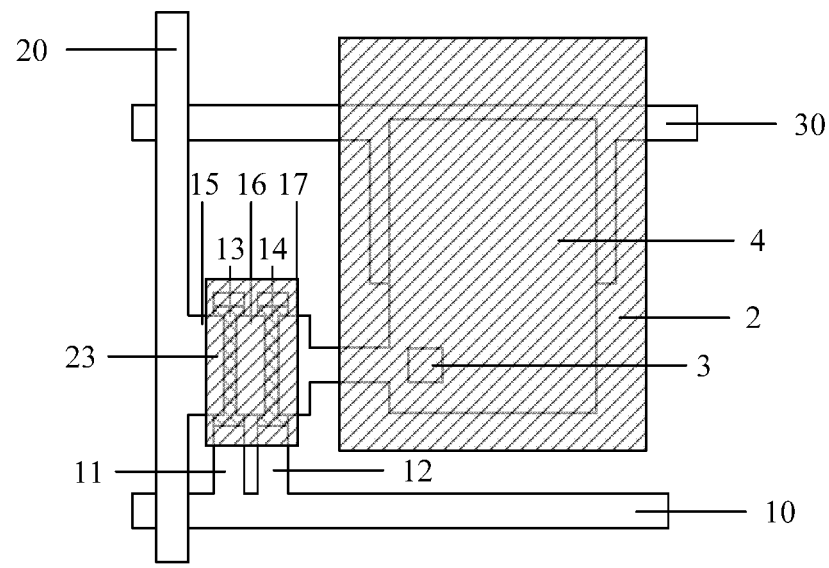
FIG. 5 is still yet another schematic view showing the display substrate according to one embodiment of the present disclosure.

In order to improve an off-state leakage current of the TFT, as shown in FIG. 5, the shielding pattern may further include a third shielding pattern 23 arranged at a side of an active layer of the TFT (including a first active layer 14 and a second active layer 13) adjacent to the display function layer. An orthogonal projection of a channel region of the active layer onto the plane where the display substrate is located is located within an orthogonal projection of the third shielding pattern 23 onto the plane where the display substrate is located. The third shielding pattern 23 may be configured to shield the channel region of the active layer. The active layer of the TFT is electrically connected to the source electrode and the drain electrode, and a portion of the active layer corresponding to a gap between the source electrode and the drain electrode is just the channel region.

In a possible embodiment of the present disclosure, the third shielding pattern 23 may be spaced apart from the pixel electrode 2 by a certain distance, so as to enable them to be insulated from each other. The third shielding pattern 23 may be connected to a power source whose output voltage is adjustable, so as to achieve a shielding effect. For the electronic paper display substrate, a voltage applied to the third shielding pattern 23 may be adjusted, so as to control the electronic ink on the third shielding pattern 23 to display the image, e.g., a black or white image. Of course, in the case that a fixed voltage is applied to the third shielding pattern 23 or the third shielding pattern 23 is grounded, it is still able to achieve the shielding effect.

In an embodiment of the present disclosure, the shielding pattern may include the first shielding pattern 21, the second shielding pattern 22 and the third shielding pattern 23, so as to prevent the display function of the display function layer from being adversely affected by the signals from the gate line 10 and the data line 20, and improve the off-state leakage current of the TFT. Further, as shown in FIG. 1, the first shielding pattern 21, the second shielding pattern 22 and the third shielding patter 23 may be formed integrally. To be specific, each of the first shielding pattern 21, the second shielding pattern 22 and the third shielding pattern 23 may be spaced apart from the pixel electrode 2 by a certain distance, so as to enable each of them to be insulated from the pixel electrode 2.

In this embodiment of the present disclosure, the TFTs include a first TFT and a second TFT. A first source electrode 16 of the first TFT is formed integrally with a second drain electrode of the second TFT. The gate line 10 is electrically connected to a first gate electrode 12 of the first TFT and a second gate electrode 11 of the second TFT. The data line 20 is electrically connected to a second source electrode 15 of the second TFT, and the pixel electrode 2 is electrically connected to a first drain electrode 17 of the first TFT.

In the embodiments of the present disclosure, two TFTs connected in series to each other may be used to control the image display. Through the two TFTs, it is able to reduce the leakage current and improve the display quality.

For the electronic paper display substrate, a reflection mechanism may be further provided. An orthogonal projection of the reflection mechanism onto the plane where the display substrate is located is located within the orthogonal projection of the pixel electrode onto the plane where the display substrate is located. The reflection mechanism is configured to reflect a light beam, which has reached the electronic paper, to a display side. In a possible embodiment of the present disclosure, in the case that the TFTs of the electronic paper display substrate include the above two TFTs connected in series to each other, the reflection mechanism 4 may be formed integrally with the first drain electrode 17, and a passivation layer 102 may be arranged between the pixel electrode 2 and the first drain electrode 17. The pixel electrode 2 may be in electrical contact with the reflection mechanism 4 through a via-hole 3 in the passivation layer 102, and then electrically connected to the first drain electrode 17, as shown in FIGS. 1 and 2.

Figure 2:
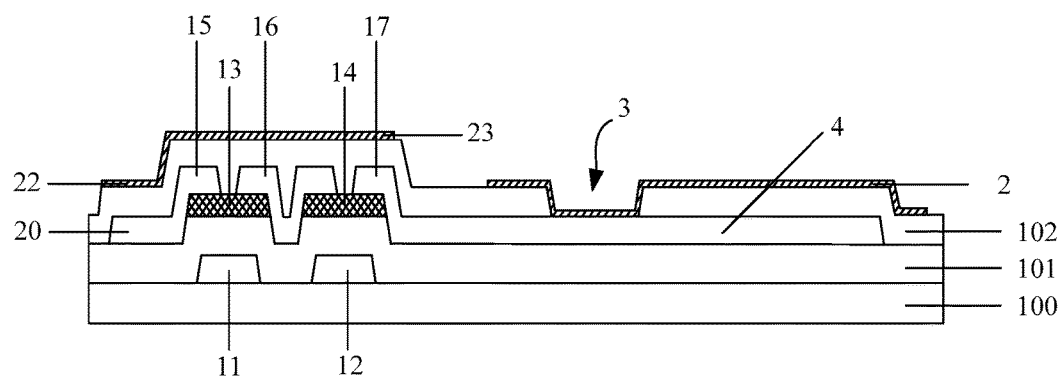
FIG. 2 is a sectional view of the display substrate along line A-A in FIG. 1.
Figure 9:
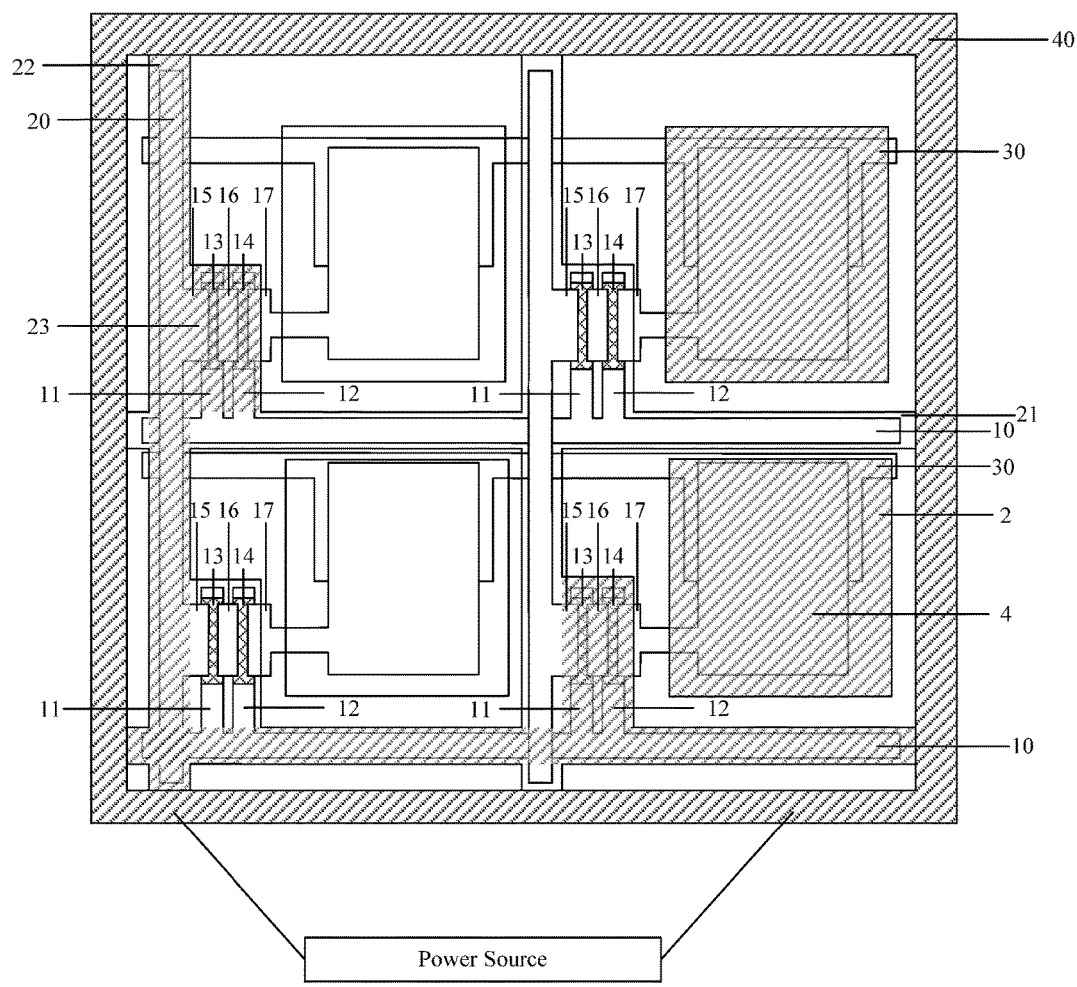
FIG. 9 is a schematic view showing a display device according to an embodiment of the present disclosure.

As shown in FIGS. 1 and 2, by taking the electronic paper display substrate as an example, the display substrate may include a transparent substrate 100, and the plurality of gate lines 10 and the plurality of data lines 20 arranged on the substrate 100 and configured to define the plurality of pixel regions. Considering the repeatability of the pixels (as shown in FIG. 9), here merely one pixel is shown. Each pixel region includes the electronic ink, the pixel electrode 2, the TFTs, the shielding pattern and the reflection mechanism 4.

Usually, the pixel electrode 2 may be made of a transparent conductive material, e.g., HIZO, ZnO, $TiO_2$, CdSnO, MgZnO, IGO, IZO, ITO or IGZO.

The TFTs may include the first TFT and the second TFT. The first source electrode 16 of the first TFT may be formed integrally with the second drain electrode of the second TFT. The first gate electrode 12 of the first TFT and the second gate electrode 11 of the second TFT may be electrically connected to the gate line 10, the second source electrode 15 of the second TFT may be electrically connected to the data line 20, and the pixel electrode 2 may be electrically connected to the first drain electrode 17 of the first TFT. A gate insulation layer 101 may be arranged between the active layer and the gate electrodes. The active layer may include the first active layer 14 of the first TFT and the second active layer 13 of the second TFT. The gate line 10 may be created from a gate metal layer identical to the first gate electrode 12 and the second gate electrode 11, and the data line 20 may be created from a source/drain metal layer identical to the source electrodes and the drain electrodes of the first and second TFTs.

The shielding pattern may be arranged at a layer identical to, and spaced apart by a certain distance from, the pixel electrode 2. The shielding pattern may include the first shielding pattern 21, the second shielding pattern 22 and the third shielding pattern 23 which are arranged at a side of the TFT adjacent to the electronic ink. The orthogonal projection of the gate line 10 onto the plane where the display substrate is located may be located within the orthogonal projection of the first shielding pattern 21 onto the plane where the display substrate is located, the orthogonal projection of the data line 20 onto the plane where the display substrate is located may be located within the orthogonal projection of the second shielding pattern 22 onto the plane where the display substrate is located, and the orthogonal projection of the channel region of the TFT onto the plane where the display substrate is located may be located within the orthogonal projection of the third shielding pattern 23 onto the plane where the display substrate is located.

The reflection mechanism 4 may be formed integrally with the first drain electrode 17, and the orthogonal projection of the reflection mechanism 4 onto the plane where display substrate is located may be located within the orthogonal projection of the pixel electrode 2 onto the plane where the display substrate is located.

The electronic paper display substrate may further include the passivation layer 102 between the first drain electrode 17 and the pixel electrode 2. The pixel electrode 2 may be in electrical contact with the reflection mechanism 4 through the via-hole 3 in the passivation layer 102, and then electrically connected to the first drain electrode 17.

In the drawings, the TFT is of a bottom-gate structure. It should be appreciated that, the TFT in the embodiments of the present disclosure may also be a top-gate structure or a coplanar structure.

Based on an identical inventive concept, the present disclosure further provides in some embodiments a method for manufacturing the above-mentioned display substrate, including steps of forming the signal line configured to transmit a signal; forming the display function layer configured to display an image; and forming the pixel electrode configured to generate an electric field for driving the display function layer to display the image. The method may further include forming the shielding pattern and the pixel electrode using an identical conductive thin film through a signal patterning process. The shielding pattern is insulated from the pixel electrode and arranged at a side of the signal line adjacent to the display function layer. An orthogonal projection of the signal line onto the plane where the display substrate is located is located within an orthogonal projection of the shielding pattern onto the plane where the display substrate is located. The shielding pattern is configured to prevent the display function of the display function layer from being adversely affected by the signal from the signal line.

According to the method in the embodiments of the present disclosure, the shielding pattern configured to prevent the display function of the display function layer from being adversely affected by the signal from the signal line may be formed together with the pixel electrode by patterning an identical conductive thin film, without any additional process for forming the shielding pattern. As a result, it is able to simplify the manufacture process and reduce the manufacture cost.

In the case that TFTs are used to control the image display, the method may further include: forming a plurality of gate lines and a plurality of data liens, so as to define a plurality of pixel regions; and forming a TFT at each pixel region in such a manner that a gate electrode of the TFT is electrically connected to the gate line, a source electrode thereof is electrically connected to the data line and a drain electrode thereof is electrically connected to the pixel electrode.

The step of forming the shielding pattern may include forming the first shielding pattern in such a manner that an orthogonal projection of the gate line onto the plane where the display substrate is located is located within an orthogonal projection of the first shielding pattern onto the plane where the display substrate is located. The first shielding pattern may be configured to prevent the display function of the display function layer from being adversely affected by the signal from the gate line.

The step of forming the shielding pattern may further include forming the second shielding pattern in such a manner that an orthogonal projection of the data line onto the plane where the display substrate is located is located within an orthogonal projection of the second shielding pattern onto the plane where the display substrate is located. The second shielding pattern may be configured to prevent the display function of the display function layer from being adversely affected by the signal from the data line.

It should be appreciated that, in order to shield the signals from both the gate line and the data line, in a possible embodiment of the present disclosure, the step of forming the shielding pattern may include forming the first shielding pattern and the second shielding pattern.

In a possible embodiment of the present disclosure, in order to improve the off-state leakage current of the TFT, a channel of the TFT may be further shielded. At this time, the step of forming the shielding pattern may further include forming the third shielding pattern at a side of the channel region of the active layer of the TFT adjacent to the display function layer in such a manner that an orthogonal projection of the channel region onto the plane where the display substrate is located is located within an orthogonal projection of the third shielding pattern onto the plane where the display substrate is located. The third shielding pattern may be configured to shield the channel region.

In a possible embodiment of the present disclosure, the step of forming the shielding pattern may include forming the first shielding pattern, the second shielding pattern and the third shielding pattern. The first shielding pattern and the second shielding pattern may be configured to prevent the display function of the display function layer from being adversely affected by the signals from the gate line and the data line. The third shielding pattern may be configured to shield the channel of the TFT, so as to improve an on-state current of the TFT, thereby to improve the performance of the TFT.

As shown in FIGS. 1, 2 and 6 to 8, by taking the electronic paper display substrate as an example, the method for manufacturing the display substrate may include the following steps.

Figure 6:
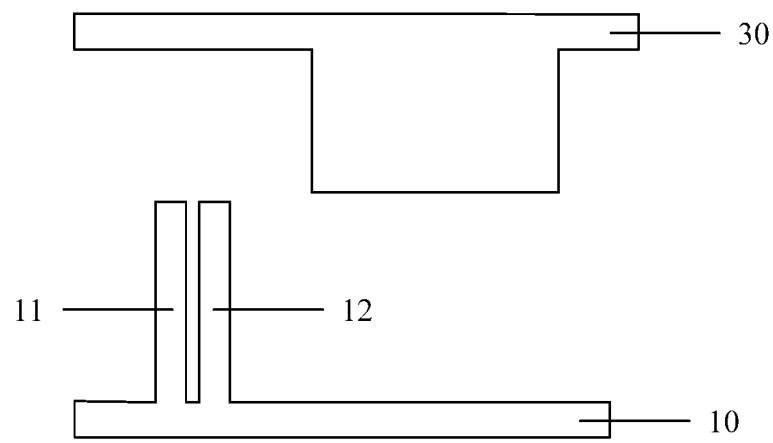
FIGS. 6 to 8 are schematic views showing the manufacture of the display substrate according to an embodiment of the present disclosure.

Step S1: as shown in FIG. 6, the first gate electrode 12, the second gate electrode 11, the plurality of gate lines 10 and a plurality of common electrode lines 30 may be formed on a transparent substrate 100 by patterning an identical gate metal layer. The gate lines 10 may be arranged parallel to the common electrode lines 30, and the first electrode 12 and the second gate electrode 11 may be formed integrally with the gate lines 10.

Step S2: a gate insulation layer 101 may be formed on the substrate 100 acquired after Step S1, as shown in FIG. 2.

Figure 7:
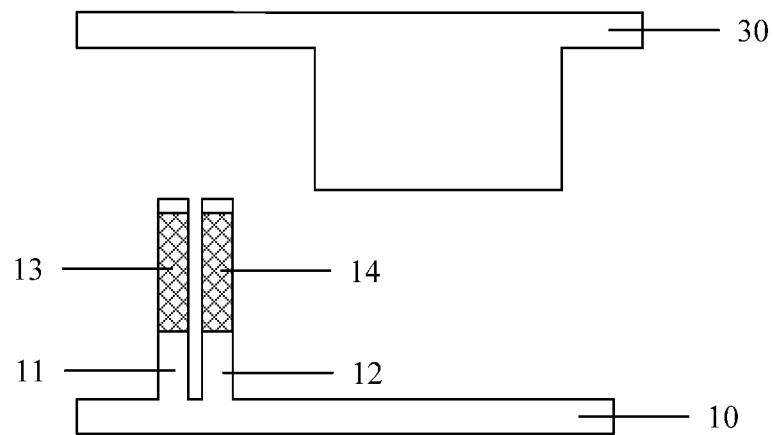

Step S3: as shown in FIG. 7, the first active layer 14 and the second active layer 13 may be formed on the substrate 100 acquired after Step S2 by patterning an identical semiconductor thin film.

Figure 8:
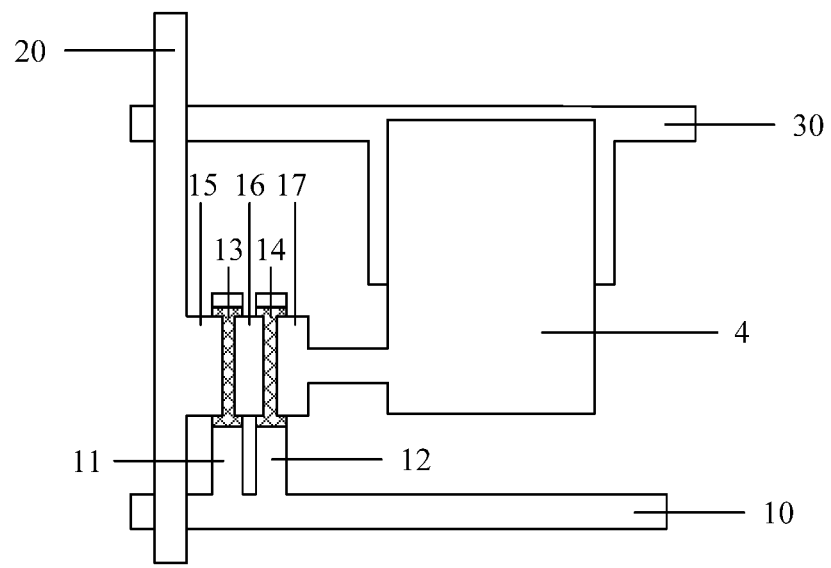

Step S4: as shown in FIG. 8, the first source electrode 16, the first drain electrode 17, the second source electrode 15, the reflection mechanism 4 and the plurality of data lines 20 may be formed on the substrate 100 acquired after Step S3 by patterning an identical source/drain metal layer. The gate lines 10 may cross the data lines 20 to define a plurality of pixel regions, and the reflection mechanism 4 may be formed integrally with the first drain electrode 17.

Each pixel region may include the first TFT and the second TFT connected in series to each other. The first TFT may include the first gate electrode 12, the first active layer 14, the first source electrode 16 and the first drain electrode 17. The second TFT may include the second gate electrode 11, the second active layer 13, the second source electrode 15 and the second drain electrode 16. The second drain electrode 16 may be formed integrally with the first source electrode 16, i.e., they may form a first share electrode. The second source electrode 15 and the data lines may be formed integrally. Opposite ends of the first source electrode 16 may be lapped onto the first active layer 14 and the second active layer 13 respectively, the second source electrode 15 may be lapped onto the second active layer 13, and the first drain electrode 17 may be lapped onto the first active layer 14. An orthogonal projection of the reflection structure 4 onto the substrate 100 may overlap an orthogonal projection of the common electrode line 30 onto the substrate 100, so as to form a storage capacitor.

Step S5: the passivation layer 102 may be formed on the substrate 100 acquired after Step S4, as shown in FIG. 2.

Step S6: as shown in FIGS. 1 and 2, the shielding pattern may be formed on the substrate 100 acquired after Step S4, and the pixel electrode 2 may be formed at each pixel region. To be specific, the pixel electrode 2 and the shielding pattern may be formed by patterning an identical transparent conductive thin film. The pixel electrode 2 may be in electrical contact with the reflection mechanism 4 through the via-hole 3 in the passivation layer 102, and then electrically connected to the first drain electrode 17 of the first TFT. The shielding pattern may be spaced apart from the pixel electrode 2 by a certain distance, and include the first shielding pattern 21, the second shielding pattern 22 and the third shielding pattern 23 formed integrally. The orthogonal projection of the gate line 10 onto the plane where the display substrate is located may be located within the orthogonal projection of the first shielding pattern 21 onto the plane where the display substrate is located, the orthogonal projection of the data line 20 onto the plane where the display substrate is located may be located within the orthogonal projection of the second shielding pattern 22 onto the plane where the display substrate is located, and the orthogonal projections of the channel regions of the first active layer 14 and the second active layer 13 onto the plane where the display substrate is located may be located within the orthogonal projection of the third shielding pattern 23 onto the plane where the display substrate is located.

Step S6: the electronic ink may be provided at each pixel region.

In the above-mentioned steps, the gate metal layer and the source/drain metal layer may be made of Cu, Al, Ag, Mo, Cr, Nd, Ni, Mn, Ti, Ta or W, or an alloy thereof. Each of the gate metal layer and the source/drain metal layer may be of a single-layered structure, or a multi-layered structure such as Cu/Mo, Ti/Cu/Ti or Mo/Al/Mo.

The present disclosure further provides in some embodiments a display device including the above-mentioned display substrate, so as to reduce the manufacture cost and improve the display quality.

The display device may further include a power source whose output voltage is adjustable. The shielding pattern of the display substrate may be electrically connected to the power source, so as to shield the signals. As shown in FIG. 9, an annular conductive pattern 40 may be arranged at a periphery of the display region and electrically connected to the shielding pattern (including the first shielding pattern 21, the second shielding pattern 22 and the third shielding pattern 23). The conductive pattern 40 may be further electrically connected to the power source whose output voltage is adjustable.

It should be appreciated that, the electrical connection mode between the shielding pattern and the power source is not limited to the above, and in some other embodiments of the present disclosure, the shielding pattern may be electrically connected, directly or through any other connection structure, to the power source, which will also fall within the scope of the present disclosure.

The display device may be a liquid crystal display device, an OLED display device or an electronic paper.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
   a signal line configured to transmit a signal;
   a display function layer configured to display an image;
   a pixel electrode; and
   a shielding pattern arranged at a layer identical to, and insulated from, the pixel electrode,
   wherein the shielding pattern is arranged at a side of the signal line adjacent to the display function layer, and an orthogonal projection of the signal line onto a plane where the display substrate is located is located within an orthogonal projection of the shielding pattern onto the plane where the display substrate is located;
   wherein the display substrate further comprises a plurality of pixel regions, each pixel region comprising a thin film transistor (TFT);
   wherein the signal line comprises a gate line configured to apply the signal to a gate electrode of the TFT, and a data line configured to apply the signal to a source electrode of the TFT;
   wherein the TFT comprises a first TFT and a second TFT connected in series, a source electrode of the first TFT and a drain electrode of the second TFT are of an integral structure, the gate line is electrically connected to a gate electrode of the first TFT and a gate electrode of the second TFT, the data line is electrically connected to a source electrode of the second TFT, and the pixel electrode is electrically connected to a drain electrode of the first TFT.

2. The display substrate according to claim 1, wherein the shielding pattern comprises a first shielding pattern, and an orthogonal projection of the gate line onto the plane where the display substrate is located is located within an orthogonal projection of the first shielding pattern onto the plane where the display substrate is located.

3. The display substrate according to claim 2, wherein the shielding pattern further comprises a second shielding pattern, and an orthogonal projection of the data line onto the plane where the display substrate is located is located within an orthogonal projection of the second shielding pattern onto the plane where the display substrate is located.

4. The display substrate according to claim 3, wherein an active layer of the TFT is in electrical contact with the source electrode and a drain electrode and comprises a channel region corresponding to a gap between the source electrode and the drain electrode, the shielding pattern further comprises a third shielding pattern arranged at a side of the channel region adjacent to the display function layer, and an orthogonal projection of the channel region onto the plane where the display substrate is located is located within an orthogonal projection of the third shielding pattern onto the plane where the display substrate is located.

5. The display substrate according to claim 4, wherein each of the first shielding pattern, the second shielding pattern and the third shielding pattern is spaced apart from and insulated from the pixel electrode.

6. The display substrate according to claim 5, wherein the first shielding pattern, the second shielding pattern and the third shielding pattern are of an integral structure.

7. The display substrate according to claim 2, wherein the display substrate is an electronic paper display substrate, a liquid crystal display substrate or an organic light-emitting diode (OLED) display substrate.

8. The display substrate according to claim 7, wherein
   in the case that the display substrate is the electronic paper display substrate, the display function layer is an electronic ink layer,
   in the case that the display substrate is the liquid crystal display substrate, the display function layer is a liquid crystal layer, and
   in the case that the display substrate is the OLED display substrate, the display function layer is a light-emitting layer.

9. The display substrate according to claim 8, wherein the display substrate is the electronic paper display substrate, each pixel region further comprises a reflection mechanism formed integrally with the drain electrode of the TFT, and an orthogonal projection of the reflection mechanism onto the plane where the display substrate is located is located within an orthogonal projection of the pixel electrode onto the plane where the display substrate is located.

10. The display substrate according to claim 9, wherein a passivation layer is arranged between the drain electrode and the pixel electrode, and the pixel electrode is electrically connected to the reflection mechanism through a via-hole in the passivation layer.

11. A display device comprising the display substrate according to claim 1.

12. The display device according to claim 11, further comprising a power source whose output voltage is adjustable, wherein the shielding pattern is electrically connected to the power source.

13. The display device according to claim 12, further comprising an annular conductive pattern arranged at a periphery of a display region, wherein the shielding pattern is electrically connected to the power source through the conductive pattern.

14. The display device according to claim 11, wherein the shielding pattern comprises a first shielding pattern, and an orthogonal projection of the gate line onto the plane where the display substrate is located is located within an orthogonal projection of the first shielding pattern onto the plane where the display substrate is located.

15. The display device according to claim 14, wherein the shielding pattern further comprises a second shielding pattern, and an orthogonal projection of the data line onto the plane where the display substrate is located is located within an orthogonal projection of the second shielding pattern onto the plane where the display substrate is located.

16. The display device according to claim 15, wherein an active layer of the TFT is in electrical contact with the source electrode and a drain electrode and comprises a channel region corresponding to a gap between the source electrode and the drain electrode, the shielding pattern further comprises a third shielding pattern arranged at a side of the channel region adjacent to the display function layer, and an orthogonal projection of the channel region onto the plane where the display substrate is located is located within an orthogonal projection of the third shielding pattern onto the plane where the display substrate is located.

17. The display device according to claim 16, wherein each of the first shielding pattern, the second shielding pattern and the third shielding pattern is spaced apart from and insulated from the pixel electrode, and the first shielding pattern, the second shielding pattern and the third shielding pattern are of an integral structure.

18. A method for manufacturing the display substrate according to claim 1, comprising steps of:
forming a signal line configured to transmit a signal;
forming a display function layer configured to display an image;
forming a pixel electrode configured to generate an electric field for driving the display function layer to display the image; and
forming a shielding pattern together with the pixel electrode using an identical conductive thin film through a single patterning process,
wherein the shielding pattern is insulated from the pixel electrode and arranged at a side of the signal line adjacent to the display function layer, an orthogonal projection of the signal line onto a plane where the display substrate is located is located within an orthogonal projection of the shielding pattern onto the plane where the display substrate is located, and the shielding pattern is configured to prevent a display function of the display function layer from being adversely affected by the signal from the signal line; and
wherein the method for manufacturing the display substrate further comprises:
forming a plurality of gate lines and a plurality of data liens, so as to define a plurality of pixel regions; and
forming a TFT at each pixel region,
wherein the TFT comprises a first TFT and a second TFT connected in series, a source electrode of the first TFT and a drain electrode of the second TFT are of an integral structure, the gate line is electrically connected to a gate electrode of the first TFT and a gate electrode of the second TFT, the data line is electrically connected to a source electrode of the second TFT, and the pixel electrode is electrically connected to a drain electrode of the first TFT.

19. A display device comprising a display substrate, wherein the display substrate comprises:
a signal line configured to transmit a signal;
a display function layer configured to display an image;
a pixel electrode; and
a shielding pattern arranged at a layer identical to, and insulated from, the pixel electrode,
wherein the shielding pattern is arranged at a side of the signal line adjacent to the display function layer, and an orthogonal projection of the signal line onto a plane where the display substrate is located is located within an orthogonal projection of the shielding pattern onto the plane where the display substrate is located;
wherein the display device further comprises a power source whose output voltage is adjustable, and the shielding pattern is electrically connected to the power source; and
wherein the display device further comprises an annular conductive pattern arranged at a periphery of a display region, and the shielding pattern is electrically connected to the power source through the conductive pattern.

* * * * *